(12) United States Patent
Goitsuka (10) Patent No.: US 11,574,860 B2
(45) Date of Patent: Feb. 7, 2023

(54) CERAMIC LAMINATED SUBSTRATE, MODULE, AND METHOD OF MANUFACTURING CERAMIC LAMINATED SUBSTRATE

(71) Applicant: Murata Manufacturing Co., Ltd., Kyoto (JP)

(72) Inventor: Takuya Goitsuka, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 37 days.

(21) Appl. No.: 17/156,026

(22) Filed: Jan. 22, 2021

(65) Prior Publication Data
US 2021/0143092 A1 May 13, 2021

Related U.S. Application Data

(63) Continuation of application No. PCT/JP2019/028917, filed on Jul. 23, 2019.

(30) Foreign Application Priority Data

Jul. 27, 2018 (JP) .............................. JP2018-140833

(51) Int. Cl.
*H01L 23/498* (2006.01)
*H01L 23/13* (2006.01)
(Continued)

(52) U.S. Cl.
CPC ........ *H01L 23/49838* (2013.01); *H01L 23/13* (2013.01); *H01L 24/13* (2013.01);
(Continued)

(58) Field of Classification Search
None
See application file for complete search history.

(56) References Cited

U.S. PATENT DOCUMENTS

| 2011/0186336 A1 | 8/2011 | Nakayama |
| 2015/0054178 A1 | 2/2015 | Ishii et al. |
| 2018/0092208 A1 | 3/2018 | Uejima |

FOREIGN PATENT DOCUMENTS

| JP | 2002-043747 A | 2/2002 |
| JP | 2004-356527 A | 12/2004 |

(Continued)

OTHER PUBLICATIONS

International Search Report for PCT/JP2019/028917 dated Oct. 1, 2019.
Written Opinion for PCT/JP2019/028917 dated Oct. 1, 2019.

*Primary Examiner* — Long Pham
(74) *Attorney, Agent, or Firm* — Pearne & Gordon LLP (57) ABSTRACT

Provided is a ceramic laminated substrate which is formed on an electronic component to be mounted and is less likely to cause mounting defects even if there is irregularity in the height of solders. The ceramic laminated substrate includes: a ceramic laminate on which ceramic layers are laminated; via conductors; terminal electrodes; and a land electrode. The land electrode has a first land electrode and a second land electrode that are used to join different terminal electrodes of a single electronic component. The area of the first land electrode is smaller than the area of the second land electrode, and the first land electrode has a bump electrode and a plating layer, the second land electrode has a membrane electrode and plating layers, and the height of the first land electrode is formed higher than the height of the second land electrode.

16 Claims, 8 Drawing Sheets

(51) Int. Cl.
*H01L 23/00* (2006.01)
*H01L 25/04* (2014.01)
*H01L 25/18* (2006.01)
*H05K 1/18* (2006.01)
*H05K 3/34* (2006.01)
*H05K 3/46* (2006.01)

(52) U.S. Cl.
CPC .............. *H01L 25/04* (2013.01); *H01L 25/18* (2013.01); *H05K 1/18* (2013.01); *H05K 3/34* (2013.01); *H05K 3/46* (2013.01); *H01L 2224/13005* (2013.01); *H01L 2224/81193* (2013.01); *H01L 2924/15787* (2013.01); *H01L 2924/19105* (2013.01)

(56) References Cited

FOREIGN PATENT DOCUMENTS

| | | | |
|---|---|---|---|
| JP | 2008-004733 A | | 1/2008 |
| JP | 2008-021883 A | | 1/2008 |
| JP | WO 2011158456 | * | 6/2010 |
| JP | 2011-176301 A | | 9/2011 |
| JP | 2015-041760 A | | 3/2015 |
| WO | 2016/194925 A1 | | 12/2016 |

* cited by examiner

CERAMIC LAMINATED SUBSTRATE, MODULE, AND METHOD OF MANUFACTURING CERAMIC LAMINATED SUBSTRATE

CROSS REFERENCE TO RELATED APPLICATION

This is a continuation of International Application No. PCT/JP2019/028917 filed on Jul. 23, 2019 which claims priority from Japanese Patent Application No. 2018-140833 filed on Jul. 27, 2018. The contents of these applications are incorporated herein by reference in their entireties.

BACKGROUND OF THE DISCLOSURE

Field of the Disclosure

The present disclosure relates to a ceramic laminated substrate including a ceramic laminate in which a plurality of ceramic layers are laminated. The present disclosure also relates to a module in which a semiconductor device is mounted on the ceramic laminated substrate of the present disclosure. The present disclosure also relates to a method of manufacturing a ceramic laminated substrate suitable for manufacturing the ceramic laminated substrate of the present disclosure.

Description of the Related Art

Figure 8A:
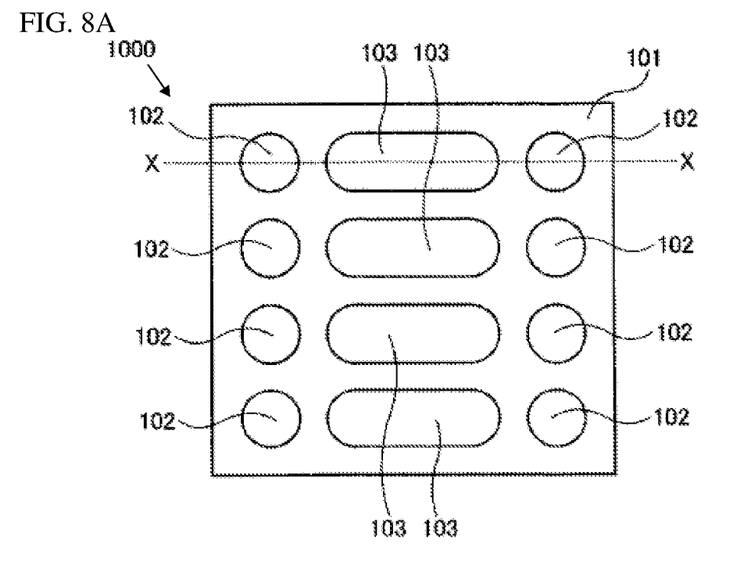
FIG. 8A is a bottom view of an electronic device 1000 disclosed in Patent Document 1.

An electronic component such as a semiconductor device may include two types of terminal electrodes, a terminal electrode having a small area and a terminal electrode having a large area. For example, an electronic device 1000 disclosed in Patent Document 1 (Japanese Patent Application Laid-Open No. 2015-41760) has, as shown in FIG. 8A, pillar bumps (terminal electrode having a small area) 102 and stripe bumps (terminal electrode having a large area) 103 formed on a mounting surface (lower main surface) of a chip 101.

Figure 8B:
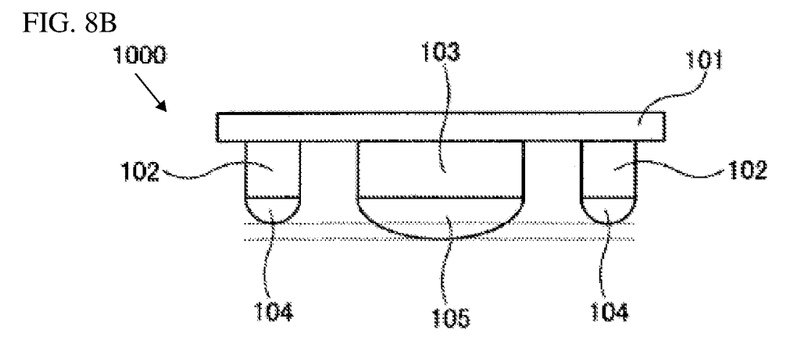
FIG. 8B is a front view of the electronic device 1000.

In the electronic device 1000, as shown in FIG. 8B, a solder 104 is formed on each pillar bump 102 having a small area, and a solder 105 is formed on each stripe bump 103 having a large area.

In the electronic device 1000, the stripe bump 103 having a large area is formed in addition to the pillar bump 102 having a small area in order to improve heat dissipation.
Patent Document 1: Japanese Patent Application Laid-Open No. 2015-41760

BRIEF SUMMARY OF THE DISCLOSURE

As disclosed in Patent Document 1, when the pillar bump 102 having a small area and the stripe bump 103 having a large area are formed on the electronic device 1000, as shown in FIG. 8B, in some cases, regarding the height from the chip 101, the solder 104 formed on the pillar bump 102 having a small area becomes lower than the solder 105 formed on the stripe bump 103 having a large area. This is because the stripe bump 103 has a larger sectional area than the pillar bump 102, and when the solders 104 and 105 are formed, the solder melts, and the height near the center of the solder 105 that rises due to the surface tension action may become higher than the height of the solder 104.

In the electronic device 1000, the irregularity occurs in the heights of the solders 104 and 105 in the process of forming the solders 104 and 105, but other than the above, the irregularity may occur in the heights of the solders 104 and 105 in the process of forming the pillar bump 102 and the stripe bump 103. That is, when the pillar bump 102 having a small area and the stripe bump 103 having a large area are formed on the mounting surface of the chip 101 by plating, in some cases, metal is highly deposited on the surface of the stripe bump 103 having a large area, and metal is not highly deposited on the surface of the pillar bump 102 having a small area. As a result, regarding the height from the chip 101, the pillar bump 102 having a small area may become lower than the stripe bump 103 having a large area. Therefore, even if the solders 104 and 105 are formed to have the same thickness, regarding the height from the chip 101, in some cases, the solder 104 formed on the pillar bump 102 having a small area becomes lower than the solder 105 formed on the stripe bump 103 having a large area.

Figure 8C:
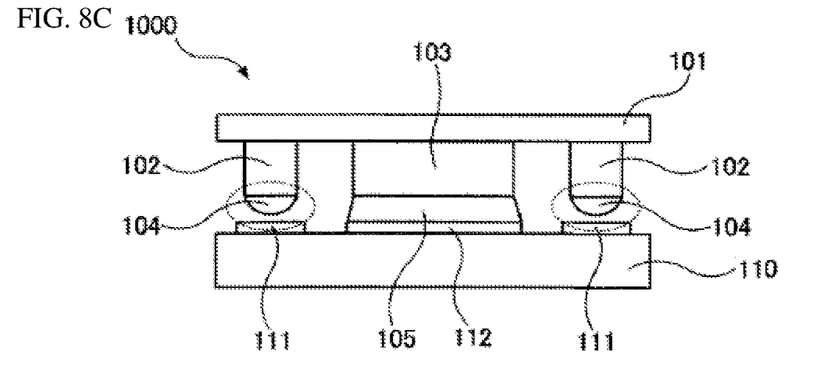
FIG. 8C is a front view showing a state in which the electronic device 1000 is mounted on a substrate 110.

Then, when the electronic device 1000 provided with the solders 104 and 105 having irregular heights is mounted on a substrate 110 provided with land electrodes (pads) 111 and 112, as shown in FIG. 8C, the high-height solder 105 is favorably bonded to the land electrode 112, but the low-height solder 104 may not be bonded to the land electrode 111. That is, a mounting defect (conduction defect) of the chip 101 on the substrate 110 may occur.

Further, when the electronic device 1000 provided with the solders 104 and 105 having irregular heights is mounted on the substrate 110 provided with the land electrodes 111 and 112, the chip 101 may be mounted at an angle with respect to the substrate 110, although not shown. That is, a mounting defect (tilt defect) of the chip 101 on the substrate 110 may occur.

The present disclosure has been made to solve the above-mentioned conventional problem, and as means thereof, a ceramic laminated substrate according to one embodiment of the present disclosure includes: a laminate made of ceramic, having a first main surface and a second main surface, and in which a plurality of ceramic layers are laminated; via conductors formed inside the laminate; a terminal electrode formed on the first main surface; and a land electrode formed on the second main surface and used to mount an electronic component. The land electrode has at least one first land electrode and at least one second land electrode having a larger area than the first land electrode. The first land electrode has a bump electrode formed on one of the via conductors exposed from the second main surface of the laminate, and a plating layer formed on a surface of the bump electrode. The second land electrode has a membrane electrode formed on another at least one of the via conductors exposed from the second main surface of the laminate and having a bonding surface to one of the ceramic layers laminated on a side closest to the second main surface of the laminate, and a plating layer formed on a surface of the membrane electrode. The first land electrode is formed to have a height higher than a height of the second land electrode.

Further, a ceramic laminated substrate according to another embodiment of the present disclosure includes: a laminate made of ceramic, having a first main surface and a second main surface, and in which a plurality of ceramic layers are laminated; via conductors formed inside the laminate; a terminal electrode formed on the first main surface; and a land electrode formed on the second main surface and used to mount an electronic component. The land electrode has at least one first land electrode and at least one second land electrode having a larger area than the first land electrode. The first land electrode has a bump electrode formed on one of the via conductors exposed from the second main surface of the laminate, and a plating layer formed on a surface of the bump electrode. The second land electrode has a plating layer formed on a surface of another one of the via conductors exposed from the second main surface of the laminate. In the second main surface of the laminate, one of the via conductors formed under the first land electrode has an exposed area smaller than an exposed area of one of the via conductors formed under the second land electrode, and the first land electrode is formed to have a height higher than a height of the second land electrode.

Further, a module can be produced by mounting a semiconductor device on the ceramic laminated substrate of the present disclosure.

In addition, a method of manufacturing a ceramic laminated substrate according to one embodiment of the present disclosure includes the steps of, in manufacturing the ceramic laminated substrate according to one embodiment of the present disclosure or the ceramic laminated substrate according to another embodiment of the present disclosure: producing a first ceramic green sheet and a second ceramic green sheet having a sintering temperature higher than a sintering temperature of the first ceramic green sheet; forming a through hole used to form a via conductor in the first ceramic green sheet, and filling the through hole with a conductive paste; forming a through hole used to form a bump electrode in the second ceramic green sheet, and filling the through hole with a conductive paste; laminating a plurality of the first ceramic green sheets and further laminating at least one layer of the second ceramic green sheet on the plurality of the first ceramic green sheets, and producing a ceramic laminate that is unfired; sintering the ceramic laminate that is unfired at a temperature higher than the sintering temperature of the first ceramic green sheet and lower than the sintering temperature of the second ceramic green sheet, and producing a composite laminate in which the second ceramic green sheet that is unsintered is laminated on the ceramic laminate having the plurality of the sintered first ceramic green sheets; and removing the second ceramic green sheet that is unsintered from the composite laminate. The conductive paste filled in the through hole formed in the second ceramic green sheet is fired to form the bump electrode.

In the ceramic laminated substrate of the present disclosure, the mounting defect of the electronic components to be mounted is suppressed.

Further, in the module of the present disclosure, the mounting defect of the semiconductor device on the ceramic laminated substrate is suppressed.

Further, according to the method of manufacturing the ceramic laminated substrate of the present disclosure, the ceramic laminated substrate of the present disclosure can be easily manufactured.

DETAILED DESCRIPTION OF THE DISCLOSURE

Hereinafter, embodiments for carrying out the present disclosure are described with reference to the drawings.

It should be noted that each embodiment is an example of an embodiment of the present disclosure, and the present disclosure is not limited to the contents of the embodiment. It is also possible to combine the contents described in different embodiments, and the contents of the embodiment in that case are also included in the present disclosure. In addition, the drawings are for the purpose of assisting the understanding of the present description and may be drawn schematically, and the constituent elements or the ratio of the dimensions between the constituent elements that are drawn may not match the ratio of the dimensions described in the present description. In addition, the constituent elements described in the present description may be omitted in the drawings, or may be drawn while omitting the number of constituent elements.

First Embodiment

FIGS. 1A, 1B, 2 and 3 show a ceramic laminated substrate 100 and a module 150 according to a first embodiment. The module 150 is produced by mounting a semiconductor device 50 on the ceramic laminated substrate 100.

Figure 1A:
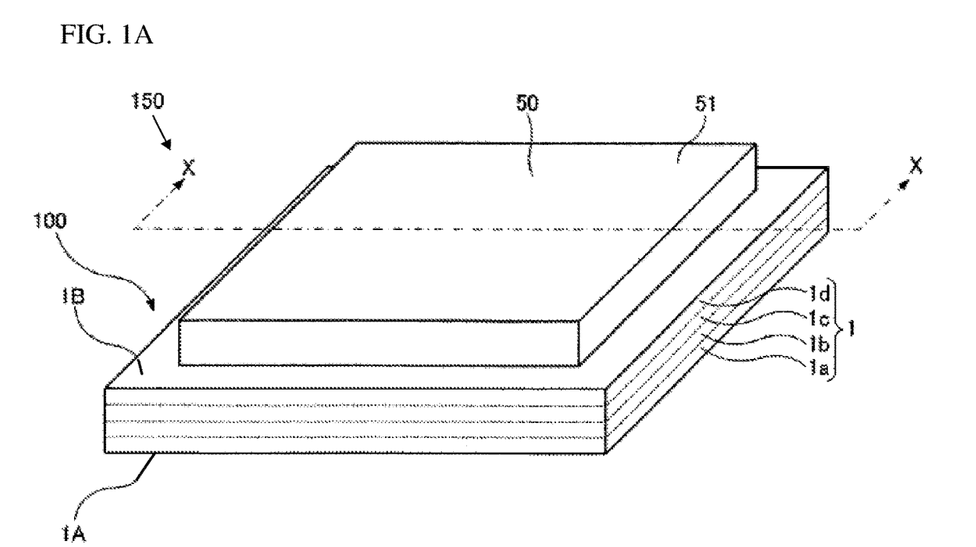
FIG. 1A is a perspective view of a module 150 according to a first embodiment (produced using a ceramic laminated substrate 100 according to the first embodiment).
Figure 1B:
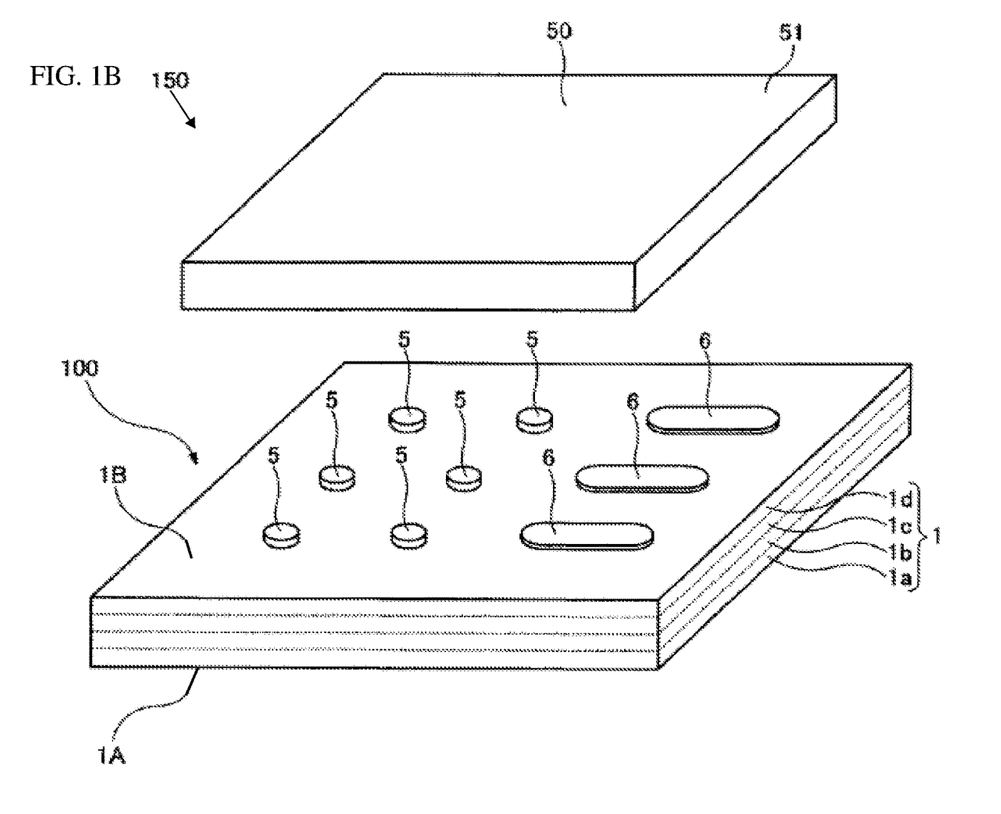
FIG. 1B is an exploded perspective view of the module 150.
Figure 2:
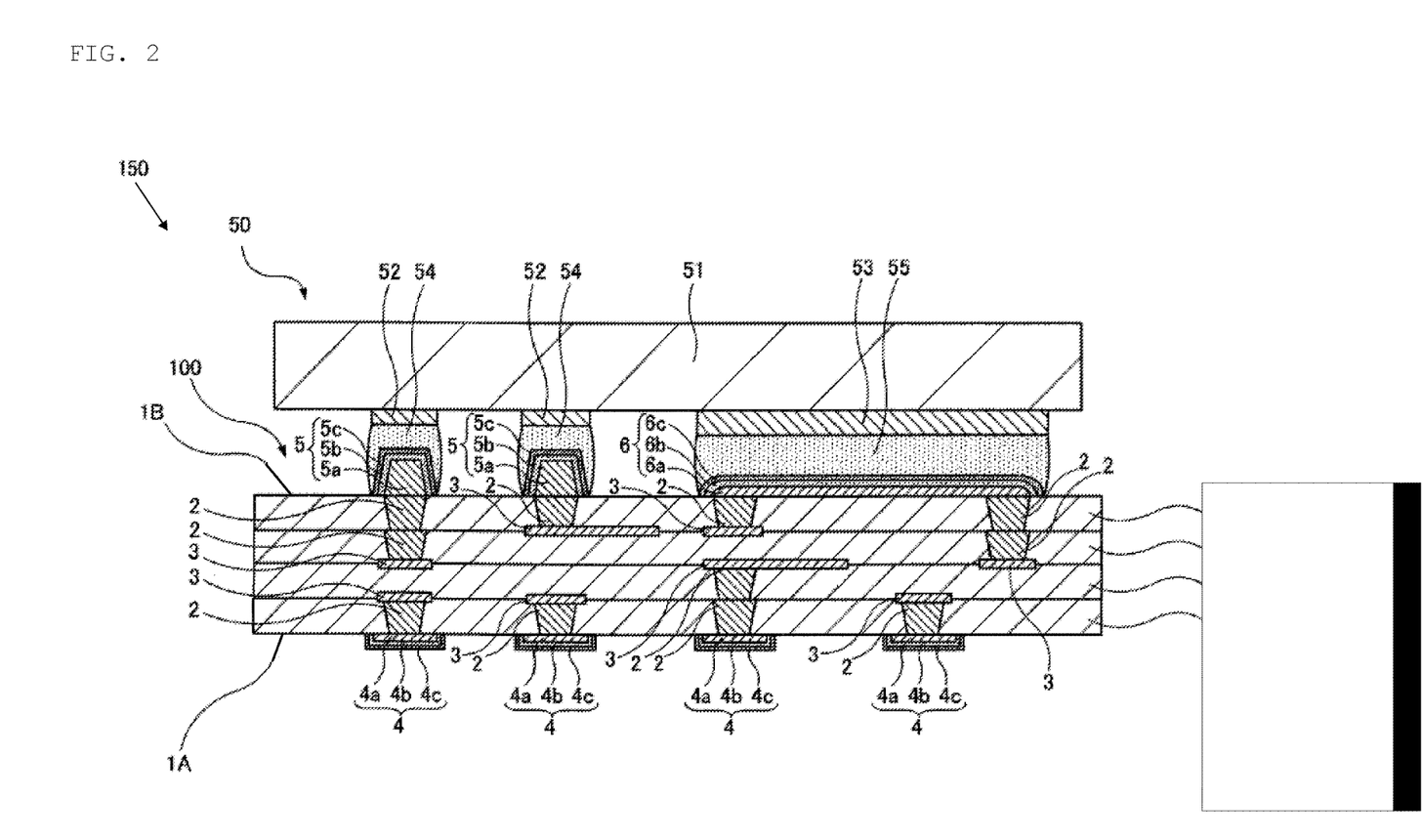
FIG. 2 is a sectional view of the module 150.
Figure 3:
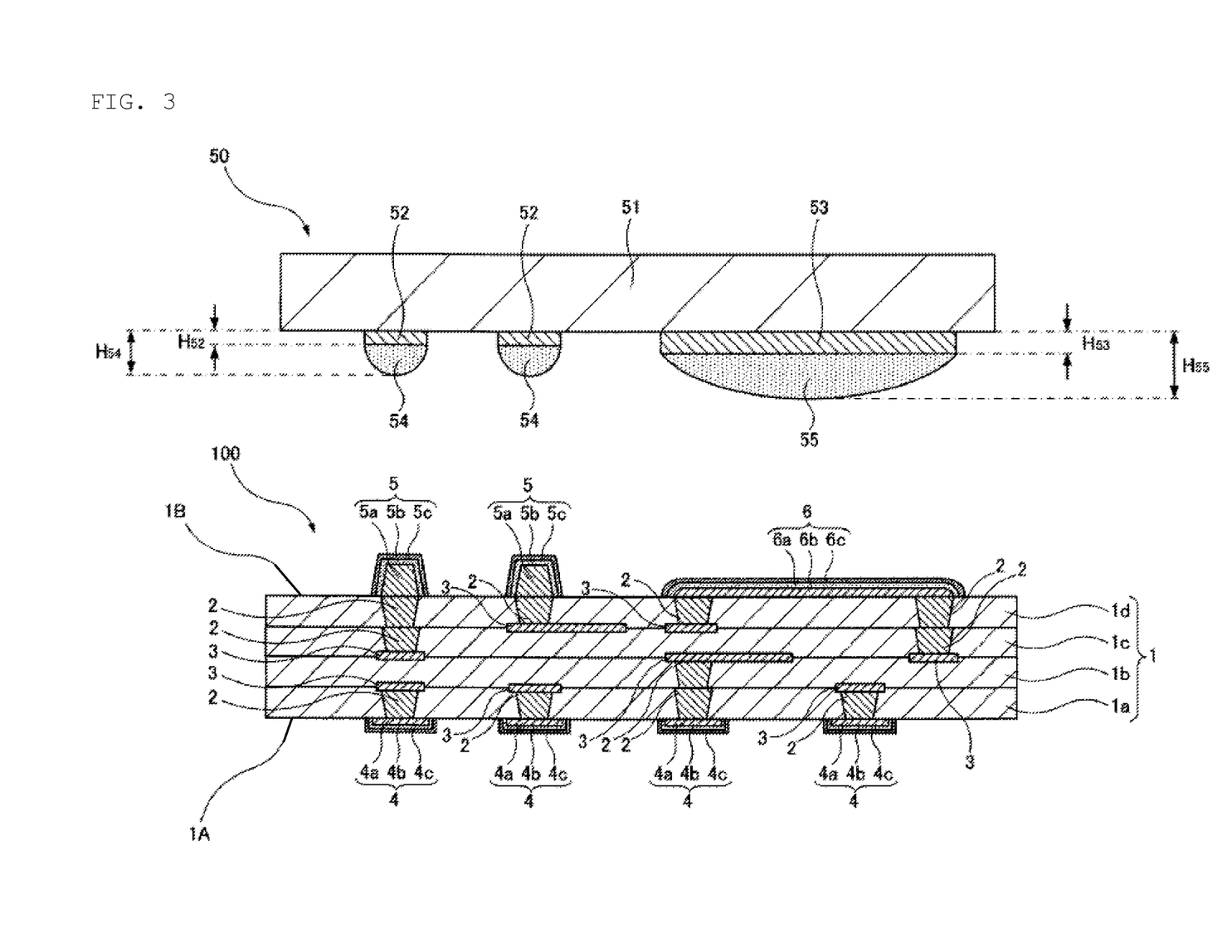
FIG. 3 is a sectional view of the ceramic laminated substrate 100 and a semiconductor device 50 in a state before the semiconductor device 50 is mounted.

FIG. 1A is a perspective view of the module 150. FIG. 1B is an exploded perspective view of the module 150 in which the semiconductor device 50 is removed from the ceramic laminated substrate 100. FIG. 2 is a sectional view of the module 150, and shows an X-X portion shown by the one dot chain line in FIG. 1A. FIG. 3 is a sectional view of the ceramic laminated substrate 100 and the semiconductor device 50 in a state before the semiconductor device 50 is mounted.

(Structure of ceramic laminated substrate 100) The ceramic laminated substrate 100 according to the present embodiment includes a ceramic laminate 1. The ceramic laminate 1 is formed by laminating ceramic layers 1a to 1d. Any material can be used for the ceramic laminate 1 (ceramic layers 1a to 1d), and for example, low temperature co-fired ceramics (LTCC) can be used. Further, any number of ceramic layers can be used and the number of layers can be increased or decreased as needed.

The ceramic laminate 1 is plate-shaped and has a first main surface 1A being a mounting surface and a second main surface 1B used for mounting electronic components.

If necessary, via conductors 2 are formed in the ceramic layers 1a to 1d. The number, formation position, diameter shape, diameter size, and the like of the via conductors 2 are freely selected. In the present embodiment, copper (Cu) is used as the main component of the via conductor 2. However, the main component of the via conductor 2 is freely selected, and an alloy of Cu, silver (Ag), an alloy of Ag, or the like may be used instead of Cu. Further, the via conductor 2 may contain a resin, ceramic powder, or the like as a sub-component.

Wiring conductors 3 are formed between the layers of the ceramic layers 1a to 1d, if necessary. The number, formation position, shape, size, thickness, and the like of the wiring conductors 3 are freely selected. In the present embodiment, Cu is used as the main component of the wiring conductor 3. However, the main component of the wiring conductor 3 is freely selected, and an alloy of Cu, Ag, an alloy of Ag, or the like may be used instead of Cu. Further, the wiring conductor 3 may contain a resin, ceramic powder, or the like as a sub-component.

Terminal electrodes 4 are formed on the first main surface 1A of the ceramic laminate 1. Each of the terminal electrodes 4 is formed to have a three-layer structure including a membrane electrode 4a, a first plating layer 4b made of nickel (Ni) formed on the membrane electrode 4a, and a second plating layer 4c made of gold (Au) formed on the first plating layer 4b. The number, formation position, shape, size, thickness, and the like of the terminal electrodes 4 are freely selected. In the present embodiment, Cu is used as the main component of the membrane electrode 4a. However, the main component of the membrane electrode 4a is freely selected, and an alloy of Cu, Ag, an alloy of Ag, or the like may be used instead of Cu. Further, the membrane electrode 4a may contain a resin, ceramic powder, or the like as a sub-component. The number of layers, material, thickness, and the like of the plating layer are also freely selected, and for example, the second plating layer 4c may be formed by tin (Sn) instead of Au.

Two types of land electrodes, first land electrodes 5 and second land electrodes 6, are formed on the second main surface 1B of the ceramic laminate 1.

Each of the first land electrodes 5 is formed on the via conductor 2 exposed from the ceramic layer 1d. Each of the second land electrodes 6 is formed on two pieces of the via conductors 2 exposed from the ceramic layer 1d and on the ceramic layer 1d.

The first land electrode 5 and the second land electrode 6 are each formed to bond different terminal electrodes of a single electronic component (semiconductor device 50).

The first land electrode 5 and the second land electrode 6 are formed to respectively have substantially the same planar shape and substantially the same size as the terminal electrodes of the electronic components to be bonded. The first land electrode 5 has a circular planar shape. The second land electrode 6 has an oval planar shape. The area of the first land electrode 5 is smaller than the area of the second land electrode 6.

The height of the first land electrode 5 is higher than the height of the second land electrode 6.

The first land electrode 5 is formed to have a three-layer structure including a bump electrode 5a formed on the via conductor 2 exposed from the ceramic layer 1d, a first plating layer 5b made of Ni and formed on the bump electrode 5a, and a second plating layer 5c made of Au and formed on the first plating layer 5b. In the present embodiment, Cu is used as the main component of the bump electrode 5a. However, the main component of the bump electrode 5a is freely selected, and an alloy of Cu, Ag, an alloy of Ag, or the like may be used instead of Cu. Further, the bump electrode 5a may contain a resin, ceramic powder, or the like as a sub-component. The number, material, thickness, and the like of the plating layer are also freely selected, and for example, the second plating layer 5c may be formed of Sn instead of Au.

As the component constituting the first land electrode 5, the same component as the component constituting the via conductor 2 may be used. In the present embodiment, the first land electrode 5 and the via conductor 2 are formed to have the same main component which is Cu, and also the same sub-components which are resin and others, and further, the same compounding ratio of the components. Therefore, the bump electrode 5a of the first land electrode 5 is bonded with high bonding strength to the via conductor 2 exposed from the ceramic layer 1d.

The second land electrode 6 is formed to have a three-layer structure including a membrane electrode 6a formed on two pieces of the via conductors 2 exposed from the ceramic layer 1d and on the ceramic layer 1d, a first plating layer 6b made of Ni and formed on the membrane electrode 6a, and a second plating layer 6c made of Au and formed on the first plating layer 6b. In the present embodiment, Cu is used as the main component of the membrane electrode 6a. However, the main component of the membrane electrode 6a is freely selected, and an alloy of Cu, Ag, an alloy of Ag, or the like may be used instead of Cu. The number, material, thickness, and the like of the plating layer are also freely selected, and for example, the second plating layer 6c may be formed by Sn instead of Au.

The membrane electrode 6a of the second land electrode 6 may contain a resin, ceramic powder, or the like as a sub-component. In the present embodiment, ceramic powder having the same main component as the ceramic layer 1d is added to the membrane electrode 6a as a bonding strength improving agent for improving the bonding strength to the ceramic layer 1d. Therefore, the membrane electrode 6a is bonded to the ceramic layer 1d with high bonding strength.

In the ceramic laminated substrate 100, the necessary electrical connection between the terminal electrodes 4, the first land electrodes 5, and the second land electrodes 6 is made by the wiring composed of the via conductors 2 and the wiring conductors 3.

(Structure of Module 150)

The semiconductor device 50 is mounted on the ceramic laminated substrate 100 described above, and the module 150 according to the present embodiment is produced.

The semiconductor device 50 includes a semiconductor element 51.

First terminal electrodes 52 and second terminal electrodes 53 are formed on the mounting surface (lower main surface) of the semiconductor element 51. Each of the first terminal electrodes 52 is a terminal bonded to the first land electrode 5 of the ceramic laminated substrate 100. Each of the second terminal electrodes 53 is a terminal bonded to the second land electrode 6 of the ceramic laminated substrate 100.

Any material can be used for the first terminal electrode 52 and the second terminal electrode 53, and in the present embodiment, Cu is used.

As described above, the first terminal electrode 52 is formed to have substantially the same planar shape and substantially the same size as the first land electrode 5. Further, the second terminal electrode 53 is formed to have substantially the same planar shape and substantially the same size as the second land electrode 6. Therefore, the first terminal electrode 52 has a circular planar shape. Further, the second terminal electrode 53 has an oval planar shape. The area of the first terminal electrode 52 is smaller than the area of the second terminal electrode 53.

As shown in FIG. 3, a height $H_{53}$ of the second terminal electrode 53 from the lower main surface (mounting surface) of the semiconductor element 51 is higher than a height $H_{52}$ of the first terminal electrode 52 therefrom. This is because when the first terminal electrode 52 and the second terminal electrode 53 are formed by plating, the second terminal electrode 53 having a large area has more metal (Cu) deposited than the first terminal electrode 52 having a small area.

A solder 54 is formed on the first terminal electrode 52. A solder 55 is formed on the second terminal electrode 53.

As shown in FIG. 3, a height $H_{55}$ of the solder 55 from the lower main surface of the semiconductor element 51 is higher than a height $H_{54}$ of the solder 54 therefrom. One reason for this is that, as described above, the height $H_{53}$ of the second terminal electrode 53 is higher than the height $H_{52}$ of the first terminal electrode 52. Another reason is that when molten solder is adhered to form the solders 54 and 55, due to the surface tension, the height of the solder on the second terminal electrode 53 having a large area is increased by an amount larger than the height of the solder on the first terminal electrode 52 having a small area.

Normally, when the semiconductor device 50 having the solder 54 and the solder 55 of different heights is mounted by a reflow process on a general substrate having a uniform land electrode height, there is a risk that a conduction defect or mounting defect such as tilt defect occurs. However, because the module 150 uses the ceramic laminated substrate 100, the semiconductor device 50 is favorably mounted on the ceramic laminated substrate 100 as shown in FIG. 2. This is because the low-height solder 54 is bonded to the high-height first land electrode 5, and the high-height solder 55 is bonded to the low-height second land electrode 6.

As described above, by using the ceramic laminated substrate 100 according to the present embodiment, the semiconductor device 50 on which the solder 54 and the solder 55 having different heights are formed can be favorably mounted.

(Example of the Method of Manufacturing the Ceramic Laminated Substrate 100)

The ceramic laminated substrate 100 can be manufactured, for example, by the following method. In the actual manufacturing process, it is common to use a mother green sheet to collectively manufacture a large number of ceramic laminated substrates 100 and divide the sheet into individual ceramic laminated substrates 100 in the middle of the manufacturing process, but for convenience of explanation, the case in which one ceramic laminated substrate 100 is manufactured is described here.

Figure 4A:
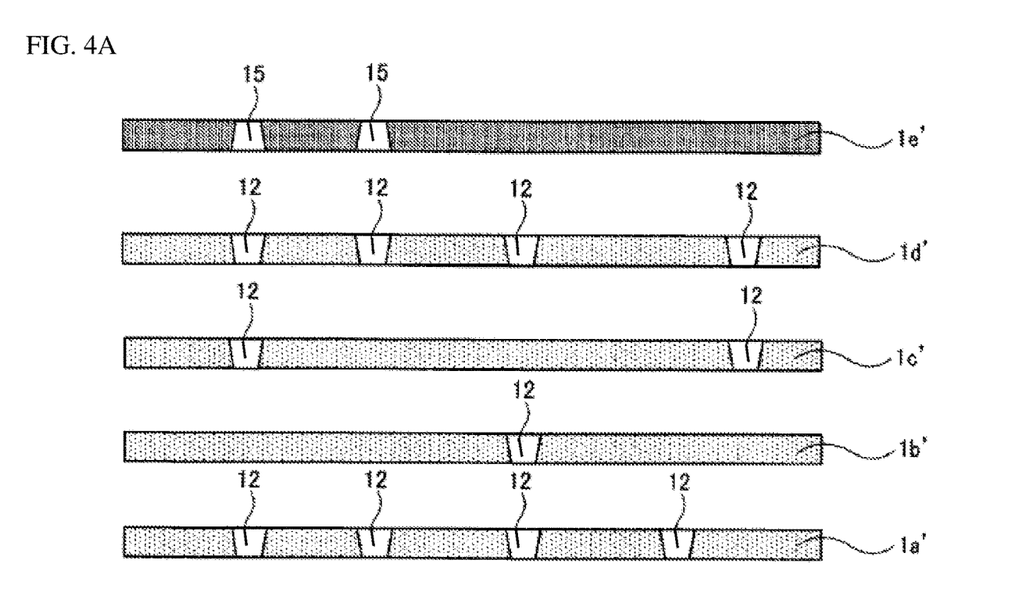
FIGS. 4A and 4B are sectional views respectively showing the steps carried out in an example of a method of manufacturing the ceramic laminated substrate 100.

First, as shown in FIG. 4A, first ceramic green sheets 1a' to 1d' for producing the ceramic layers 1a to 1d are prepared. In addition to these, a second ceramic green sheet 1e' having a sintering temperature higher than that of the first ceramic green sheets 1a' to 1d' is prepared.

Next, as also shown in FIG. 4A, through holes 12 for forming the via conductors 2 are formed in the first ceramic green sheets 1a' to 1d'. Further, through holes 15 for forming the bump electrodes 5a are formed in the second ceramic green sheet 1e'.

Figure 4B:
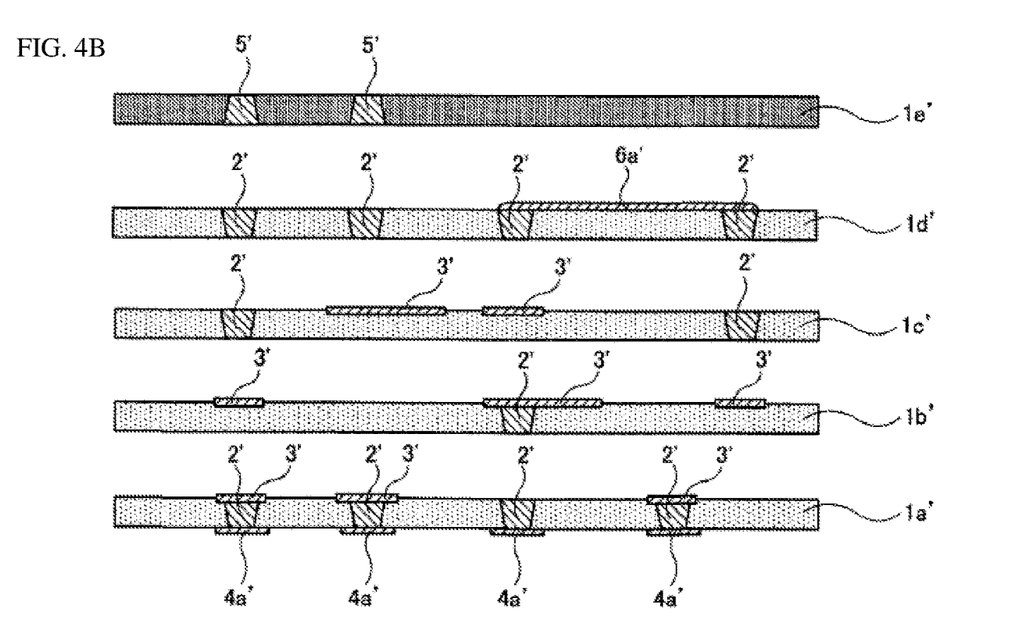

Next, as shown in FIG. 4B, each of the through holes 12 is filled with a conductive paste 2', and each of the through holes 15 is filled with a conductive paste 5'. In the present embodiment, the same conductive paste is used for the conductive paste 2' and the conductive paste 5'.

Next, as also shown in FIG. 4B, a conductive paste 4a' is applied in desired shape and thickness in order to form each of the membrane electrodes 4a of the terminal electrodes 4 on the lower main surface of the first ceramic green sheet 1a'. Further, a conductive paste 3' is applied in desired shape and thickness in order to form each of the wiring conductors 3 on the upper main surfaces of the first ceramic green sheets 1a', 1b', and 1c'. Further, a conductive paste 6a' is applied in desired shape and thickness in order to form each of the membrane electrodes 6a of the second land electrode 6 on the upper main surface of the first ceramic green sheet 1d'. If a large thickness is required, the conductive paste may be repeatedly applied.

Figure 5C:
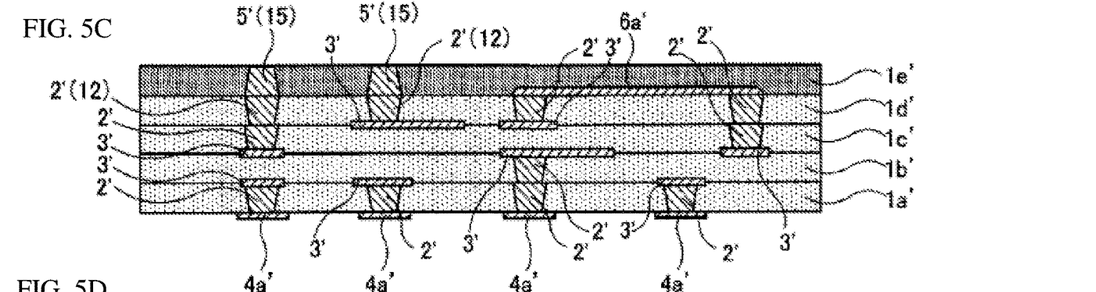
FIGS. 5C to 5F are continuations of FIG. 4B, and are sectional views respectively showing the steps carried out in the example of the method of manufacturing the ceramic laminated substrate 100.

Next, as shown in FIG. 5C, the first ceramic green sheets and the second ceramic green sheet 1a' to 1e' are laminated, pressed and integrated to produce an unfired ceramic laminate. When the through hole 12 is formed in the first ceramic green sheet 1d' and the through hole 15 is formed in the second ceramic green sheet 1e', the diameters of the openings of the through holes on two main surfaces of the ceramic green sheet may become different from each other depending on the method of forming the through hole. For example, when the through holes 12 and 15 are formed by irradiation with a laser beam, the diameter of the opening on the side irradiated with the laser beam becomes large, and the diameter of the opening on the opposite side becomes small. When the first ceramic green sheets and the second ceramic green sheet 1a' to 1e' are laminated to produce the unfired ceramic laminate, it is preferable that the opening on the large-diameter side of the through hole 12 of the first ceramic green sheet 1d' face the opening on the large-diameter side of the through hole 15 of the second ceramic green sheet 1e'. In this case, the bonding area between the via conductor 2 and the bump electrode 5a that are formed becomes large, and the via conductor 2 and the bump electrode 5a are bonded with high bonding strength.

Figure 5D:
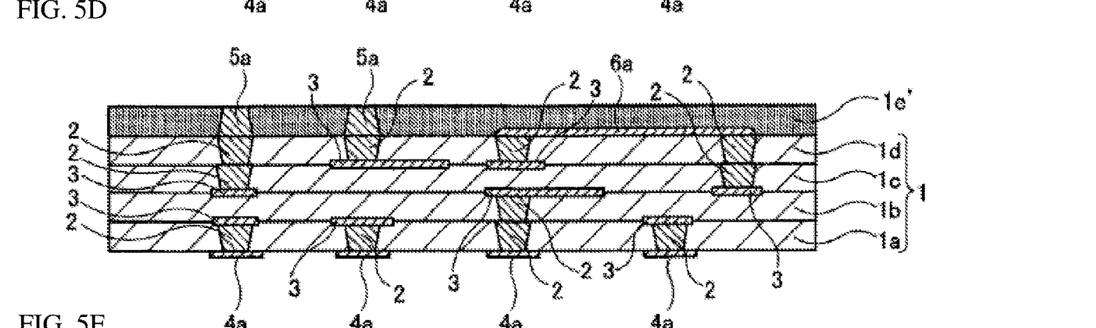

Next, as shown in FIG. 5D, the unfired ceramic laminate produced by laminating the first ceramic green sheets and the second ceramic green sheet 1a' to 1e' is fired at a temperature higher than the sintering temperature of the first ceramic green sheets 1a' to 1d' and lower than the sintering temperature of the second ceramic green sheet 1e', to produce a composite laminate in which the unsintered second ceramic green sheet 1e' is laminated on the ceramic laminate 1 having the plurality of the sintered first ceramic green sheets 1a' to 1d'.

Figure 5E:
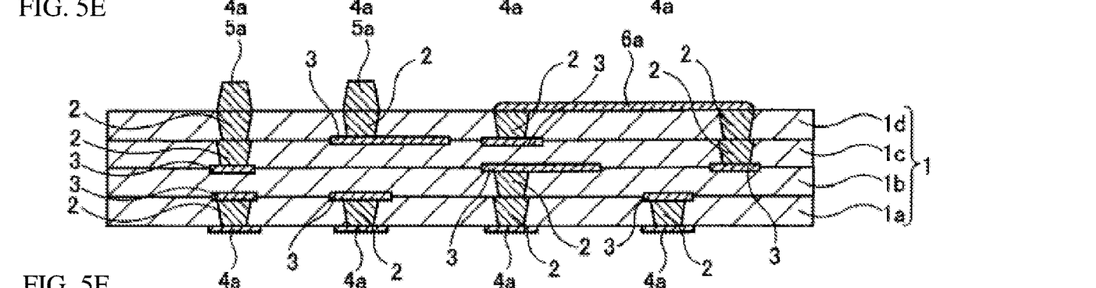

Next, as shown in FIG. 5E, the unsintered second ceramic green sheet 1e' is removed from the composite laminate to obtain the ceramic laminate 1. The unsintered second ceramic green sheet 1e' can be removed by, for example, blasting.

Figure 5F:
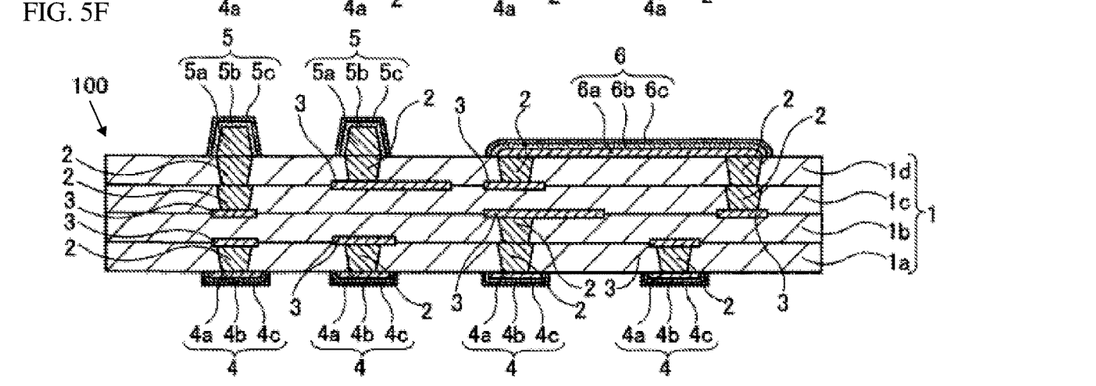

Next, as shown in FIG. 5F, the first plating layer 4b and the second plating layer 4c are formed on the membrane electrode 4a to form the terminal electrode 4. Further, the first plating layer 5b and the second plating layer 5c are formed on the bump electrode 5a to form the first land electrode 5. Further, the first plating layer 6b and the second plating layer 6c are formed on the membrane electrode 6a to form the second land electrode 6.

As described above, the ceramic laminated substrate 100 is completed.

Second Embodiment

Figure 6:
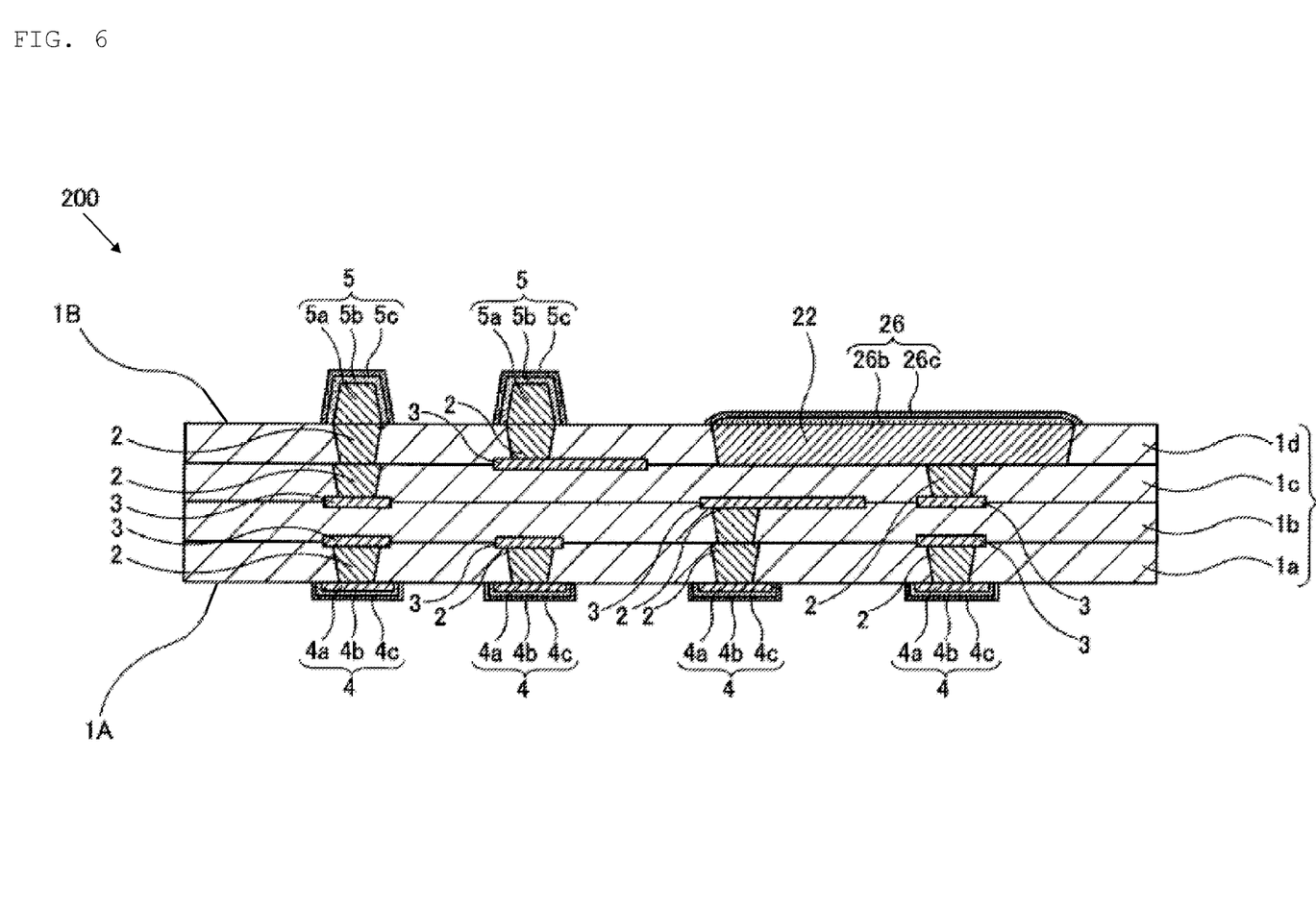
FIG. 6 is a sectional view of a ceramic laminated substrate 200 according to a second embodiment.

FIG. 6 shows a ceramic laminated substrate 200 according to a second embodiment. FIG. 6 is a sectional view of the ceramic laminated substrate 200.

The ceramic laminated substrate 200 is a modification of a part of the configuration of the ceramic laminated substrate 100 according to the first embodiment. Specifically, in the ceramic laminated substrate 100, the second land electrode 6 is composed of the membrane electrode 6a formed on the ceramic layer 1d, the first plating layer 6b, and the second plating layer 6c. The ceramic laminated substrate 200 is modified from this, and a via conductor 22 having a large area is formed in the ceramic layer 1d, and a first plating layer 26b and a second plating layer 26c are directly formed on the via conductor 22 without interposing a membrane electrode. Further, the first plating layer 26b and the second plating layer 26c are used to form a second land electrode 26. Other configurations of the ceramic laminated substrate 200 are the same as those of the ceramic laminated substrate 100.

The via conductor 22 having a large area can be formed by, for example, irradiating and scanning the first ceramic green sheet 1d' for forming the ceramic layer 1d with a laser beam to form a through hole having a large area and filling the through hole with a conductive paste.

In this way, the second land electrode 26 can be formed by forming the first plating layer 26b and the second plating layer 26c on the surface of the via conductor 22 having a large exposed area and formed on the ceramic layer 1d laminated on the side closest to the second main surface 1B of the ceramic laminate 1.

Third Embodiment

Figure 7:
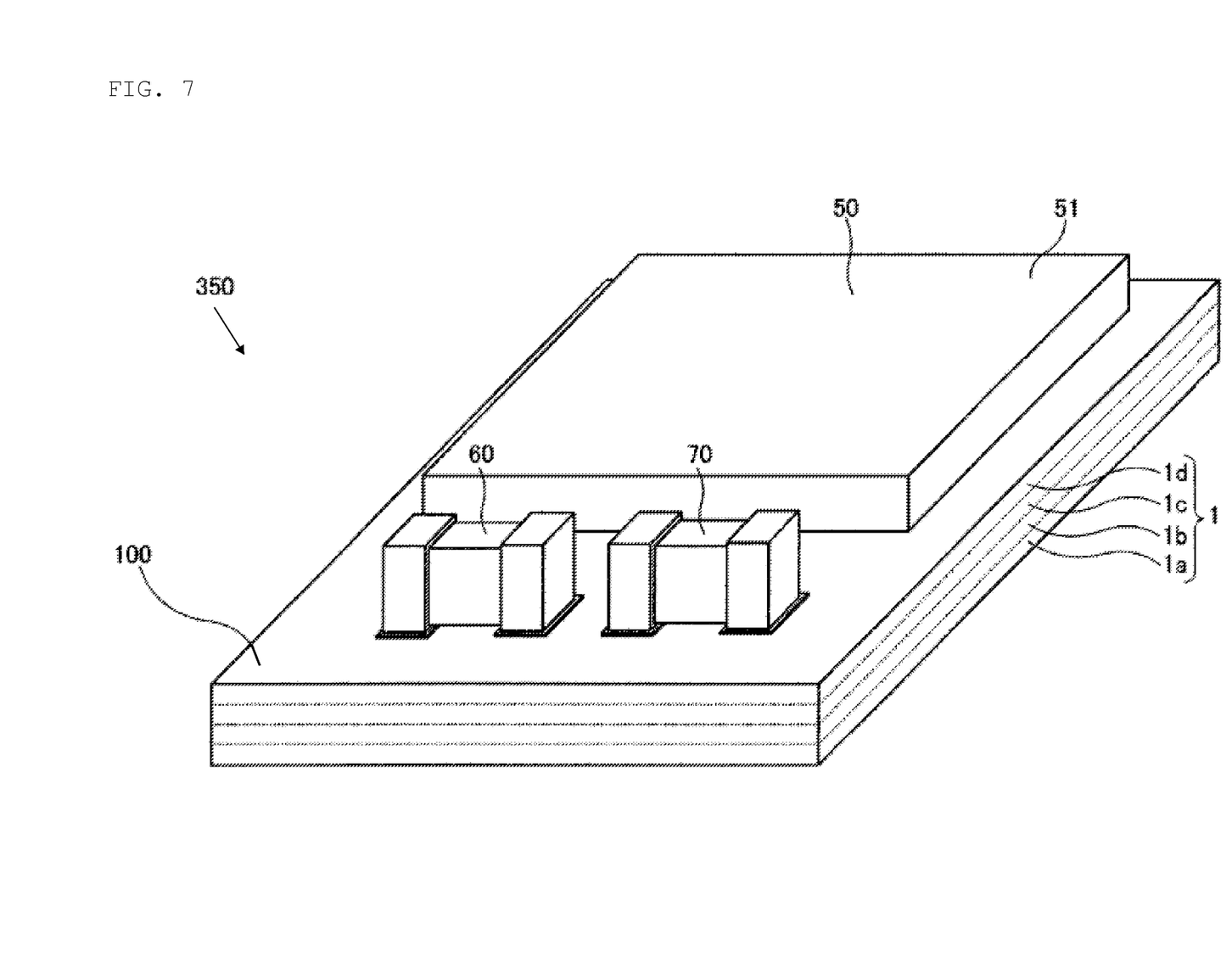
FIG. 7 is a perspective view of a module 350 according to a third embodiment.

FIG. 7 shows a module 350 according to a third embodiment. FIG. 7 is a perspective view of the module 350.

The module 350 is a modification of a part of the configuration of the module 150 according to the first embodiment. Specifically, in the module 150, one piece of the semiconductor device 50 is mounted on the ceramic laminated substrate 100. The module 350 is a modification of this, and in addition to the semiconductor device 50, other electronic components (passive components) 60 and 70 are mounted on the ceramic laminated substrate 100. In the module 350, a ceramic laminated substrate 100 is formed larger in area than the ceramic laminated substrate 100 of the module 150 in order to have the electronic components 60 and 70 mounted. Other configurations of the module 350 are the same as module 150.

As described above, not only the semiconductor device but also various electronic components can be mounted on the ceramic laminated substrate 100.

The ceramic laminated substrate 100 and the module 150 according to the first embodiment, the ceramic laminated substrate 200 according to the second embodiment, and the module 350 according to the third embodiment have been described above. However, the present disclosure is not limited to the above-described contents, and various modifications can be made in accordance with the gist of the disclosure.

For example, in the ceramic laminated substrate 100, four ceramic layers 1a to 1d are laminated to form the ceramic laminate 1, but the number of layers of the ceramic layers can be freely selected and can be increased or decreased as needed.

Further, in the module 150, molten solder is adhered to the first terminal electrode 52 and the second terminal electrode 53 of the semiconductor device 50 to form the solders 54 and 55, respectively, but any method can be used for forming the solders 54 and 55 and the method is not limited to this.

The ceramic laminated substrate according to one embodiment of the present disclosure and the ceramic laminated substrate according to another embodiment are as described in the section of "BRIEF SUMMARY OF THE DISCLOSURE".

The bump electrode is, for example, an electrode formed by filling a hole formed in a ceramic green sheet with a conductive paste, firing the conductive paste, and then removing the ceramic green sheet. The membrane electrode is, for example, an electrode formed by applying a conductive paste to a ceramic green sheet and firing the conductive paste. However, the method of forming the bump electrode and the method of forming the membrane electrode are not limited to these methods, and may be formed by other methods.

In these ceramic laminated substrates, the main component of the via conductor formed under the first land electrode and the main component of the bump electrode of the first land electrode may be the same. In this case, the via conductor and the bump electrode are bonded with high bonding strength. Any type of main component can be used, and for example, Cu or Ag can be used.

In this case, the component of the via conductor formed under the first land electrode and the component of the bump electrode of the first land electrode may be the same. In this case, the via conductor and the bump electrode are bonded with higher bonding strength. That is, in the via conductor and the bump electrode, the same component may be used including not only the main component but also the sub-component and the like.

Further, a bonding strength improving agent for improving the bonding strength to the ceramic layer laminated on the side closest to the second main surface of the laminate may be added to the membrane electrode of the second land electrode. In this case, the bonding strength of the membrane electrode of the second land electrode to the ceramic layer laminated on the second main surface side is improved. Any material can be used for the material of the bonding strength improving agent, and for example, ceramic powder having the same main component as the ceramic layer laminated on the side closest to the second main surface of the laminate can be used.

Further, the planar shapes of the first land electrode and the planar shape of the second land electrode on the second main surface of the ceramic laminate are freely selected, and for example, the planar shape of the first land electrode can be made circular and the planar shape of the second land electrode can be made oval.

1: Ceramic laminate
1a to 1d: Ceramic layer
2: Via conductor
3: Wiring conductor
4: Terminal electrode
4a: Membrane electrode
4b: First plating layer
4c: Second plating layer
5: First land electrode
5a: Bump electrode
5b: First plating layer
5c: Second plating layer
6: Second land electrode
6a: Membrane electrode
6b: First plating layer
6c: Second plating layer
50: Semiconductor device
51: Semiconductor element
52: First terminal electrode
54: Second terminal electrode
54, 55: Solder

The invention claimed is:

1. A ceramic laminated substrate comprising:
   a ceramic laminate having a first main surface and a second main surface, and including a plurality of laminated ceramic layers;
   via conductors provided inside the laminate;
   a terminal electrode provided on the first main surface; and
   a land electrode for mounting an electronic component, the land electrode being provided on the second main surface,
   wherein:
   the land electrode has at least one first land electrode and at least one second land electrode, the second land electrode having a larger area than the first land electrode;
   the first land electrode has a bump electrode provided on one of the via conductors exposed from the second main surface of the laminate, and a first plating layer provided on a surface of the bump electrode;
   the second land electrode has a membrane electrode provided on at least one of other ones of the via conductors exposed from the second main surface of the laminate and having a bonding surface to one of the ceramic layers laminated on a side closest to the second main surface of the laminate, and a second plating layer provided on a surface of the membrane electrode;
   a height of the first land electrode is higher than a height of the second land electrode; and
   a height of the bump electrode is higher than a height of the membrane electrode.

2. The ceramic laminated substrate according to claim 1, wherein a main component of the one of the via conductors provided under the first land electrode is identical with a main component of the bump electrode of the first land electrode.

3. The ceramic laminated substrate according to claim 2, wherein components of the one of the via conductors provided under the first land electrode are identical with components of the bump electrode of the first land electrode.

4. The ceramic laminated substrate according to claim 1, wherein the membrane electrode of the second land electrode includes a bonding strength improving agent added to improve a bonding strength to the one of the ceramic layers laminated on the side closest to the second main surface of the laminate.

5. The ceramic laminated substrate according to claim 4, wherein the bonding strength improving agent is ceramic powder containing a main component identical with a main component of the one of the ceramic layers laminated on the side closest to the second main surface of the laminate.

6. The ceramic laminated substrate according to claim 1, wherein, on the second main surface of the laminate, the first land electrode has a circular planar shape and the second land electrode has an oval planar shape.

7. A module comprising:
   the ceramic laminated substrate according to claim 1; and
   an electronic component mounted on the ceramic laminated substrate,
   wherein:
   the electronic component is a semiconductor device including a plurality of terminal electrodes; and
   at least one of the terminal electrodes of the semiconductor device is bonded to the first land electrode, and at least one of other ones of the terminal electrodes of the semiconductor device is bonded to the second land electrode.

8. A method of manufacturing the ceramic laminated substrate according to claim 1, comprising the steps of:
   producing a plurality of first ceramic green sheets and a second ceramic green sheet, the second ceramic green sheet having a sintering temperature higher than a sintering temperature of each of the first ceramic green sheets;
   forming a first through hole for forming a via conductor in the first ceramic green sheets, and filling the first through hole with a conductive paste;
   forming a second through hole for forming a bump electrode in the second ceramic green sheet, and filling the second through hole with a conductive paste;
   laminating the plurality of the first ceramic green sheets and further laminating at least one layer of the second ceramic green sheet on the plurality of the first ceramic green sheets, and producing an unfired ceramic laminate;
   sintering the unfired ceramic laminate at a temperature higher than the sintering temperature of each of the first ceramic green sheets and lower than the sintering temperature of the second ceramic green sheet, and producing a composite laminate including the unsintered second ceramic green sheet laminated on the ceramic laminate having the plurality of the sintered first ceramic green sheets; and
   removing the unsintered second ceramic green sheet from the composite laminate,
   wherein the conductive paste filled in the second through hole formed in the second ceramic green sheet is fired to form the bump electrode.

9. The ceramic laminated substrate according to claim 2, wherein, on the second main surface of the laminate, the first land electrode has a circular planar shape and the second land electrode has an oval planar shape.

10. The ceramic laminated substrate according to claim 3, wherein, on the second main surface of the laminate, the first land electrode has a circular planar shape and the second land electrode has an oval planar shape.

11. The ceramic laminated substrate according to claim 4, wherein, on the second main surface of the laminate, the first land electrode has a circular planar shape and the second land electrode has an oval planar shape.

12. The ceramic laminated substrate according to claim 5, wherein, on the second main surface of the laminate, the first land electrode has a circular planar shape and the second land electrode has an oval planar shape.

13. A module comprising:
   the ceramic laminated substrate according to claim 2; and
   an electronic component mounted on the ceramic laminated substrate,
   wherein:
   the electronic component is a semiconductor device including a plurality of terminal electrodes; and
   at least one of the terminal electrodes of the semiconductor device is bonded to the first land electrode, and at least one of other ones of the terminal electrodes of the semiconductor device is bonded to the second land electrode.

14. A module comprising:
   the ceramic laminated substrate according to claim 3; and
   an electronic component mounted on the ceramic laminated substrate,
   wherein:
   the electronic component is a semiconductor device including a plurality of terminal electrodes; and at least one of the terminal electrodes of the semiconductor device is bonded to the first land electrode, and at least one of other ones of the terminal electrodes of the semiconductor device is bonded to the second land electrode.

15. A module comprising:

the ceramic laminated substrate according to claim 4; and an electronic component mounted on the ceramic laminated substrate, wherein:

the electronic component is a semiconductor device including a plurality of terminal electrodes; and at least one of the terminal electrodes of the semiconductor device is bonded to the first land electrode, and at least one of other ones of the terminal electrodes of the semiconductor device is bonded to the second land electrode.

16. A module comprising:

the ceramic laminated substrate according to claim 5; and an electronic component mounted on the ceramic laminated substrate, wherein:

the electronic component is a semiconductor device including a plurality of terminal electrodes; and at least one of the terminal electrodes of the semiconductor device is bonded to the first land electrode, and at least one of other ones of the terminal electrodes of the semiconductor device is bonded to the second land electrode.

* * * * *